United States Patent
Tomita et al.

(10) Patent No.: US 9,164,377 B2
(45) Date of Patent: Oct. 20, 2015

(54) METHOD FOR CLEANING IMPRINTING MASK

(71) Applicant: KABUSHIKI KAISHA TOSHIBA, Tokyo (JP)

(72) Inventors: Hiroshi Tomita, Kanagawa-ken (JP); Hidekazu Hayashi, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 2 days.

(21) Appl. No.: 13/938,296

(22) Filed: Jul. 10, 2013

(65) Prior Publication Data

US 2014/0170307 A1 Jun. 19, 2014

(30) Foreign Application Priority Data

Dec. 14, 2012 (JP) ................................. 2012-273967

(51) Int. Cl.
*B65B 33/00* (2006.01)
*G03F 7/00* (2006.01)

(52) U.S. Cl.
CPC .................................. *G03F 7/0002* (2013.01)

(58) Field of Classification Search
CPC .................................................. G03F 7/70925
USPC .......................................................... 427/154
See application file for complete search history.

(56) References Cited

U.S. PATENT DOCUMENTS

| 2007/0090574 A1* | 4/2007 | Terasaki et al. ............... 264/496 |
| 2007/0187875 A1* | 8/2007 | Terasaki et al. ............... 264/496 |
| 2009/0317727 A1* | 12/2009 | Beck ................................. 430/5 |
| 2010/0132742 A1 | 6/2010 | Tomita et al. |
| 2013/0200553 A1* | 8/2013 | Yamada et al. ............... 264/402 |

FOREIGN PATENT DOCUMENTS

| JP | 2000-195767 | 7/2000 |
| JP | 2007-294625 | 11/2007 |
| JP | 2010-214859 A | 9/2010 |
| JP | 2010-264756 | 11/2010 |
| WO | WO2012056911 A1 * | 5/2012 |

* cited by examiner

*Primary Examiner* — Dah-Wei D Yuan
*Assistant Examiner* — Nga Leung V Law
(74) *Attorney, Agent, or Firm* — Patterson & Sheridan, LLP

(57) ABSTRACT

According to one embodiment, provided is a method for cleaning an imprinting mask including a template having an uneven pattern, a base layer disposed on the template, and a sacrificial film disposed on the base layer. In the method for cleaning the imprinting mask, the sacrificial film is removed, and a contaminant adhered on the sacrificial film is removed from the template pattern.

5 Claims, 2 Drawing Sheets

METHOD FOR CLEANING IMPRINTING MASK

CROSS-REFERENCE TO RELATED APPLICATION

This application is based upon and claims the benefit of priority from Japanese published unexamined application 2012-273967, filed Dec. 14, 2012, the entire contents of which are incorporated herein by reference.

FIELD

The embodiment described herein relates generally to a method for cleaning an imprint lithography printing mask.

BACKGROUND

Currently, patterning using nano-imprint technology for semiconductor device processing is being considered in order to form fine patterns on a semiconductor substrate in the process of fabricating a semiconductor device. Since a mask used in nano-imprint technology has an uneven pattern of fine (very small) features impressed as depressions therein, contamination may occur at the impression or depression portions of the mask when imprinting a mask layer of UV curable resin. For instance, a contaminant may become lodged into the recessed portion along with the UV curable resin by the pressing force of the mask against the resist layer, and block off the recessed portion of the mask where it is lodged at the time of imprinting of the resist layer. A contaminant lodged in the recesses of the mask is hard to remove by a cleaning technology that cleans the mask surface, such as binary fluid cleaning and ultrasonic cleaning. Another method can be employed to etch the mask and then lift off the contaminant, but that method changes a pattern dimension of the finely processed mask by also etching the mask.

DETAILED DESCRIPTION

Figure 1:
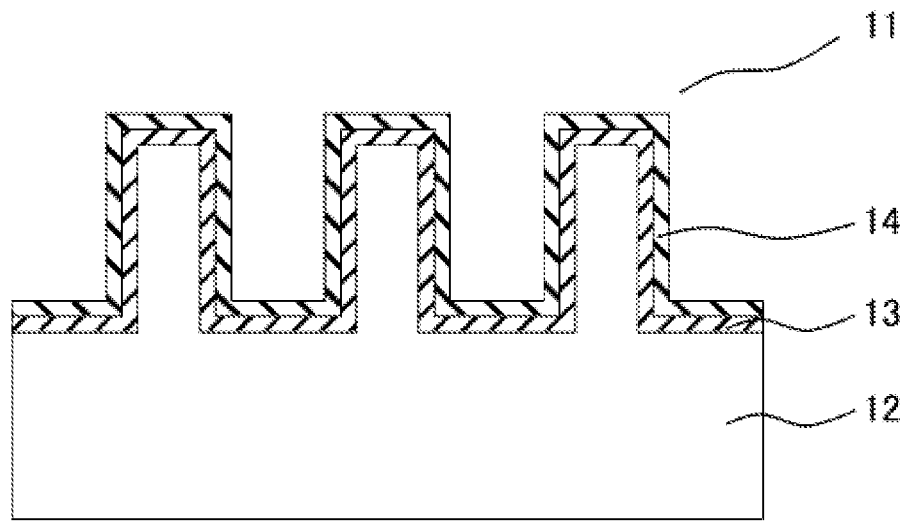
FIG. 1 is a cross-sectional view schematically illustrating one example of a configuration of a portion of an imprinting mask according to an embodiment.

In general, according to one embodiment, there is provided a method for cleaning an imprinting mask used to imprint a pattern in a masking material, in which a contaminant on the imprinting mask can be removed without etching the features of the mask.

A method for cleaning an imprinting mask according to one embodiment of the invention includes cleaning of a template having an uneven embossed, i.e., a three dimensional pattern thereon or therein, a base layer disposed on the template, and a sacrificial film disposed on the base layer. In the method for cleaning the imprinting mask, the sacrificial film is removed from the mask, and hence a contaminant adhered on the sacrificial film is removed from the mask.

(First Embodiment)

A method for cleaning an imprinting mask according to a first embodiment will be described herein while referring to the drawings. However, the present disclosure is not limited by the embodiment.

FIG. 1 is a horizontal cross-sectional view schematically illustrating one example of a configuration of the imprinting mask according to the first embodiment. An imprinting mask 11 has a template 12, which includes an uneven pattern configured in a quartz substrate which, for instance, is disposed on a principal surface of the substrate. The uneven pattern can be configured by with fine, i.e., small on the scale of nanometer width dimensions, or with line and space patterning with a few nm of depressed portions and extending portions, for instance.

A base layer 13 is disposed on the uneven pattern on the principal surface of the template 12. The base layer 13 is not filled within the entire concave portion of the uneven pattern, but is formed along with the uneven pattern. As described later, a material that has a resistance to etching is used for the base layer 13. A material that is also resistant to etching is used for the template 12 which is disposed below the base layer 13. The base layer 13 can be a silicon nitride film having a thickness of 0.5 nm. The base layer may be formed by ALD (Atomic Layer Deposition) or CVD (Chemical Vapor Deposition).

A sacrificial film 14 is disposed on the base layer 13. The sacrificial film 14 is not filled within the entire concave portion of the uneven pattern, but is formed along with the uneven pattern. A self-assembled monolayer (SAM) can be employed as the sacrificial film 14, for instance. The self-assembled monolayer can be formed by reacting a silane coupling agent reacting with a hydroxyl group (—OH group) on the surface of a silicon nitride film forming the base layer 13. The thickness of the self-assembled monolayer can be adjusted by controlling the length of a carbon of normal chain; on the template 12, the thickness of the sacrificial film 14 is appropriately adjusted depending on the desired dimensions of the pattern features being imprinted with the mask. In the present embodiment, the thickness of the self-assembled monolayer is about 2 nm, for instance. A water repellent group can be used for a reactive group of the self-assembled monolayer on the surface side in the imprinting mask 11. Accordingly, the detaching of the template 12 from the UV curable agent can be improved upon conducting nano-imprint as will be described later, and the number of contaminants adhering to the imprinting mask 11 can be further suppressed.

A surface treatment can be implemented on the imprinting mask 11 before forming the self-assembled monolayer as a sacrificial film 14, so that the hydroxyl group is on the surface of the base layer 13. Consequently, a silane coupling reaction more easily occurs, and thus a finer (thinner) self-assembled monolayer can be formed.

Next, a method for forming patterning by nano-imprint technology using the imprinting mask 11 described above, and a method for cleaning the imprinting mask 11 will be explained. FIGS. 2A to 2D are horizontal cross-sectional views schematically illustrating one example of a method for cleaning the imprinting mask 11 according to the first embodiment.

Figure 2A:
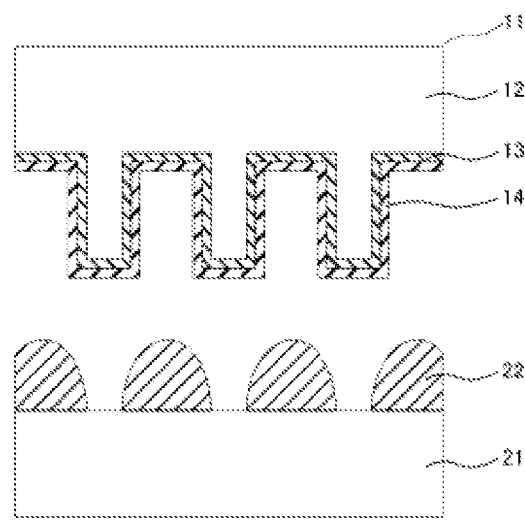
FIGS. 2A to 2D are cross-sectional views schematically illustrating one example of a method for cleaning the imprinting mask according to the embodiment, showing a portion of the pattern of the mask being cleaned.

As illustrated in FIG. 2A, a UV curable agent 22 is coated on a workpiece substrate 21. The UV curable agent 22 can be selectively coated by an ink-jet method, for instance. The UV curable agent 22 includes polysilane, silicon compounds, metallic oxide nanoparticles, solvents and additives.

Figure 2B:
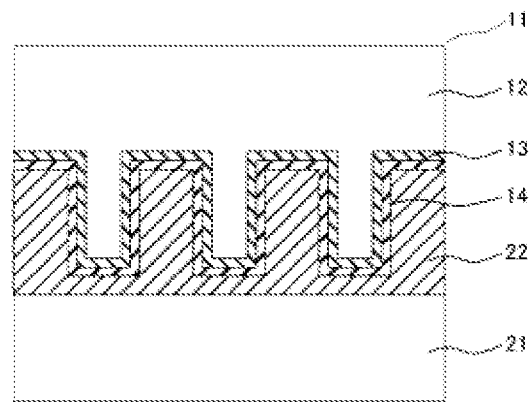

Subsequently, as illustrated in FIG. 2B, the principal surface of the imprinting mask 11 is pressed over the UV curable agent 22 that is formed on the workpiece substrate 21 so that the UV curable agent 22 fills the depressions in the pattern disposed on the principal surface of the imprinting mask 11. After that, an energy source such as a light such as UV is irradiated from the back-side of the imprinting mask 11 to cure the UV curable agent 22 in situ.

Figure 2C:
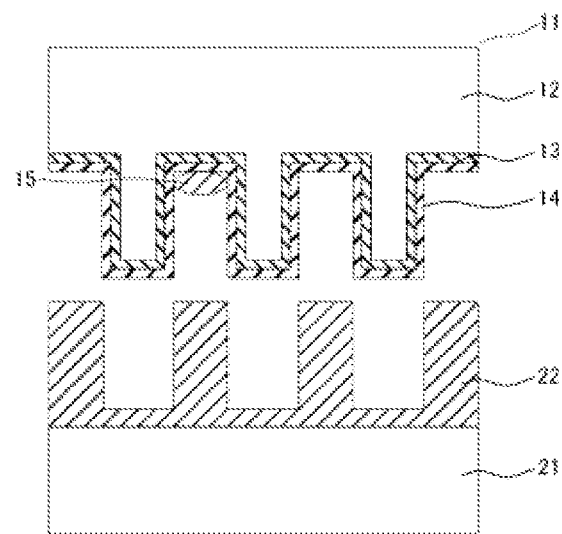

Next, as illustrated in FIG. 2C, the imprinting mask 11 is detached from the UV curable agent 22. Upon detaching, cured UV curable agent 22 may adhere inside the recessed portion of the pattern of the imprinting mask 11 and remain as a contaminant. A method for cleaning the imprinting mask 11 according to the present embodiment is to purge such a contaminant without etching of the underlying template 12.

Figure 2D:
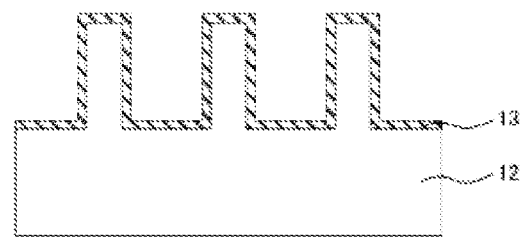

As illustrated in FIG. 2D, the self-assembled monolayer that is a sacrificial film 14 disposed on the imprinting mask 11 is lifted off to remove the sacrificial layer 14, and any contaminants trapped or remaining in the mask pattern. At this time, removal of the self-assembled monolayer can be conducted by a chemical cleaning using a hot sulfuric acid and hydrogen peroxide solution, or by a dry ashing such as by oxygen ashing. A contaminant lodged, trapped or otherwise remaining in the recessed portions of the imprinting mask 11 can be simply physically adhering to, i.e., physically wedged or stuck in place such as by electrostatic attraction. By conducting dry ashing of the sacrificial film 14, the contaminant and any ashed sacrificial layer 14 can be easily removed by SC1 cleaner (NH4OH/H2O2/H2O) at room temperature without lift-off. A binary fluid cleaning in which detergent is purely added, or diluted IPA can also be used instead of SC1 cleaner at room temperature, in order to remove the contaminant easily.

It is hard to remove a contaminant inside the concave portion of the imprinting mask having a fine pitched pattern (nano size depressions) using the binary fluid cleaning methodologies of the past; lift-off of a sacrificial film on which contaminants are adhered is an efficient method to remove contaminants. However, in case of forming the sacrificial film 14 directly on the template 12 without forming the base layer 13 and lifting-off the sacrificial film 14 by an alkaline cleaner, the template 12 will be etched and a dimension of the fine uneven pattern of the template 12 will be changed. Particularly, since the nano-imprint technology is based on the premise of the repeated usage of the same template 12, the dimension of the template 12 will gradually shift from the designed value if the features of the imprint mask are etched.

According to the method for cleaning the imprinting mask 11 of the present embodiment, contaminants adhered on the sacrificial film 14, which is the top layer of the imprinting mask 11, can be lifted off along with the coating, thus a hard-to-remove contaminant inside the recessed portion of pattern can be efficiently removed. In addition, since the sacrificial film 14 on the base layer 13 is lifted off, a contaminant can be removed without etching the template 12. In other words, a contaminant inside the concave portion can be removed without changing the dimension of the fine uneven pattern of the template 12.

Subsequently, in order to conduct a next pattern formation using an imprinting mask 11, the sacrificial film 14 which was removed is again formed on the base layer 13 by ALD as illustrated in FIG. 1. Accordingly, imprinting can be conducted while no contaminant is on the template, and also a pattern with accurate dimension can be formed.

Incidentally, if the surface of the template 12 is exposed by etching of the base layer 13, which is a silicon nitride film, as a result of removal of the sacrificial film 14, or when the dimensions of the pattern of the imprinting mask 11 change by a deposit of material thereon that cannot be removed by etching of the self-assembled monolayer, the base layer 13 can fully removed by an intended agent and then is formed again. Consequently, the imprinting mask having an appropriate dimension of the nano-imprinting pattern can be used by repeatedly.

As described above, in the first embodiment, a contaminant is removed by lift-off of the sacrificial film 14, following the formation of the base layer 13 on the template 12 and formation of the sacrificial film 14 on the base layer 13. Accordingly, a contaminant on the imprinting mask 11 can be cleaned and contaminants removed without etching the pattern features of the underlying template 12.

(Second Embodiment)

The second embodiment will be described herein. Identical parts with the imprinting mask of the first embodiment will be indicated with identical references in the configuration of the second embodiment and explanations will be omitted.

A silicon dioxide film is used in this embodiment instead of the self-assembled monolayer for the sacrificial film 14 in the first embodiment. The sacrificial film 14 can be a silicon dioxide film having a thickness of 1.5 nm formed by ALD.

As illustrated in FIGS. 2A to 2C, patterning is conducted on the UV curable agent 22 on the workpiece substrate 21 using the imprinting mask 11.

Next, as illustrated in FIG. 2D, a silicon dioxide film, which is the sacrificial film 14 disposed on the imprinting mask 11, is lifted off. At this time, etching of the silicon dioxide film is conducted in a condition in which silicon nitride film is not easily etched, more specifically, a condition in which the sacrificial film 14 will be selectively etched as compared to the material of the underlying base layer 13. For example, etching/cleaning is conducted using an SC1 cleaner (alkaline cleaner) at 50° C.

According to the method for cleaning an imprinting mask of the present embodiment, contaminants adhered on the sacrificial film 14, which is the top or outer layer of the imprinting mask 11, can be lifted off along with the coating, and thus a hard-to-remove contaminant inside the concave portion of the fine uneven pattern can be efficiently removed. In addition, since the sacrificial film 14 on the base layer 13 is lifted off, a contaminant can be removed without etching of the underlying template 12. In other words, a contaminant inside the concave portion can be removed without changing the dimension of the fine (very small dimensioned) pattern of the template 12.

Subsequently, in order to conduct a next pattern formation, the silicon dioxide film removed for cleaning of the mask is once again formed on the base layer 13 by ALD.

As described above, in the second embodiment, a contaminant is removed by lift-off of the sacrificial film 14, following the formation of the base layer 13 on the template 12 and formation of the sacrificial film 14 on the base layer 13. Accordingly, a contaminant on the imprinting mask 11 can be cleaned up and removed without etching the template 12.

In the present embodiment, the base layer 13 is described as a silicon nitride film, the sacrificial film 14 is described as a silicon dioxide film, and a chemical agent for removing the sacrificial film 14 is described as a SC1 cleaner; however, the combination is not restricted to above example, as long as those are a combination of a material with which the sacrificial film 14 is etched but not for the base layer 13 upon removing the sacrificial film 14, and an agent with which the sacrificial film 14 can be removed.

The lift-off of the sacrificial film 14 described above can be conducted for every imprinting (every pattern formation), or can also be conducted when the contaminant accumulated to a certain level after imprinting at plural times. At this point, the contaminant level on the imprinting mask 11 is preferably to be examined by various kinds of contaminant inspection devices.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for cleaning an imprinting mask including a template having an uneven pattern and a base layer, the method comprising:

removing a sacrificial film layer formed by using a silane coupling agent reaction on a base layer that is formed along a concave portion and a convex portion of the uneven pattern; and removing a contaminant adhered on the sacrificial film layer, wherein the sacrificial film layer is silicon oxide.

2. The method of claim 1, wherein the base layer comprises silicon nitride.

3. The method of claim 1, further including the step of removing the contaminant by exposing the contaminant to a cleaning solution.

4. The method of claim 1, further including the step of forming another sacrificial film layer on the base layer.

5. The method of claim 4, wherein the step of removing the another sacrificial film layer comprises exposing the sacrificial film layer to a cleaner including $NH_4OH$, $H_2O_2$, and $H_2O$.

* * * * *